US010033388B1

(12) United States Patent
Rawat et al.

(10) Patent No.: US 10,033,388 B1
(45) Date of Patent: Jul. 24, 2018

(54) CIRCUIT FOR AND METHOD OF ENABLING THE SELECTION OF A CIRCUIT

(71) Applicant: Xilinx, Inc., San Jose, CA (US)

(72) Inventors: Mini Rawat, Mountain View, CA (US); Pierre Maillard, Campbell, CA (US); Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/465,402

(22) Filed: Mar. 21, 2017

(51) Int. Cl.
*H03K 19/177* (2006.01)
*H03K 19/00* (2006.01)

(52) U.S. Cl.
CPC ... *H03K 19/17764* (2013.01); *H03K 19/0013* (2013.01); *H03K 19/1776* (2013.01); *H03K 19/17728* (2013.01)

(58) Field of Classification Search
CPC ......... H03K 19/17764; H03K 19/0013; H03K 19/17728; H03K 19/1776
USPC ....................................... 326/13, 37–41, 47
See application file for complete search history.

(56) References Cited

U.S. PATENT DOCUMENTS

| | | | |
|---|---|---|---|
| 6,512,289 B1 | 1/2003 | Elward | |
| 6,835,579 B2 | 12/2004 | Elward | |
| 7,138,820 B2 | 11/2006 | Goetting et al. | |
| 7,202,700 B2 * | 4/2007 | Isono | H03K 19/0016 326/121 |
| 7,230,445 B1 | 6/2007 | Goetting et al. | |
| 7,233,532 B2 | 6/2007 | Vadi et al. | |
| 7,235,999 B2 | 6/2007 | Goetting et al. | |
| 7,408,381 B1 | 8/2008 | Drimer et al. | |
| 7,504,854 B1 * | 3/2009 | Look | G11C 5/14 326/38 |
| 7,599,299 B2 | 10/2009 | Goetting et al. | |
| 7,714,610 B2 * | 5/2010 | He | G06F 17/5054 326/38 |
| 7,933,277 B1 | 4/2011 | Schumacher et al. | |
| 8,469,640 B2 | 6/2013 | Maillard et al. | |
| 8,572,432 B1 | 10/2013 | Parlour et al. | |
| 9,281,807 B1 | 3/2016 | Maillard et al. | |
| 9,304,174 B1 | 4/2016 | Taylor et al. | |
| 9,438,244 B2 * | 9/2016 | Sood | H03K 19/17784 |
| 2009/0039952 A1 * | 2/2009 | Wang | G06F 17/5045 327/544 |
| 2011/0198941 A1 * | 8/2011 | Suzuki | H03K 19/0016 307/116 |
| 2013/0169350 A1 * | 7/2013 | Whatmough | G01R 31/30 327/530 |

* cited by examiner

*Primary Examiner* — Dylan White
(74) *Attorney, Agent, or Firm* — John J. King (57) ABSTRACT

An integrated circuit enables the selection of a circuit. According to one implementation, a plurality of redundant circuits provide a predetermined function and a voltage sensor may be coupled to receive a reference voltage. A selection circuit may be coupled to the voltage sensor and the reference voltage, wherein the selection circuit selects one of the plurality of redundant circuits to be implemented in the integrated circuit based upon a detected voltage of the reference voltage of the reference voltage.

20 Claims, 7 Drawing Sheets

CIRCUIT FOR AND METHOD OF ENABLING THE SELECTION OF A CIRCUIT

TECHNICAL FIELD

The present invention relates generally to integrated circuit devices, and in particular, to a circuit for and a method of enabling the selection of a circuit.

BACKGROUND

The performance of different integrated circuits devices can vary based upon a number of factors. More particularly, individual elements formed in the integrated circuits, such as transistors for example, can vary between different integrated circuits. These variations between elements can lead to different performance specifications, such as speed or power specifications, for the individual integrated circuit devices. Integrated circuit devices may then be placed in a category based upon a specification for the device. For example, the integrated circuits may be "binned" according to speed. However, another factor that affects the performance of an integrated circuit device is a value of a reference voltage that is applied to the device and used to provide power to the circuits of the integrated circuit device. The value of a reference voltage can also affect the operation and performance of particular circuits of the integrated circuit device. Depending upon the implementation of a circuit, some reference voltages may lead to reduced or undesirable performance of a circuit of an integrated circuit device.

Accordingly, circuits and methods that enable the flexible operation of integrated circuit devices are beneficial.

SUMMARY

An integrated circuit enabling the selection of a circuit is described. The integrated circuit comprising a plurality of redundant circuits providing a predetermined function; a voltage sensor coupled to receive a reference voltage; and a selection circuit coupled to the voltage sensor and the reference voltage, wherein the selection circuit selects one of the plurality of redundant circuits to be implemented in the integrated circuit based upon a detected voltage of the reference voltage.

A method of enabling the selection of a circuit is also described. The method comprises implementing a plurality of redundant circuits that provide a predetermined function; receiving a reference voltage at a voltage sensor; configuring a selection circuit to receive the reference voltage at an input and an output of the voltage sensor at a control terminal; and selecting one of the plurality of redundant circuits to be implemented in the integrated circuit based upon a detected voltage of the reference voltage.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods optimize performance for integrated circuit devices that receive voltage supplies that may vary. Voltage level plays a role in defining a performance specification for the integrated circuit device. According to one implementation, a circuit will sense voltage supplies using a voltage sensor, such as an on-chip voltage sensor. A circuit that is optimized for a voltage may be turned on, based on whether a supply voltage is a minimum (Vmin), midrange (Vmid) or high (Vhigh) voltage, while others may remain off. By way of example, on-chip voltage supply may include ranges for Vmin from 0.65V to 0.69V, a range of Vmid from 0.70V to 0.77V, and Vhigh from 0.78 to 0.85V. If Vmin is received by the integrated circuit, the voltage is low, and power dissipated is low. Therefore, an optimized circuit for high performance may be selected for a plurality of redundant circuits. Because power is low due to lower voltage, the circuit may achieve high performance, while power specifications are still met. Depending on a sensed voltage level by a voltage sensor circuit, a corresponding circuit optimized for the second voltage will be turned on.

Figure 1:
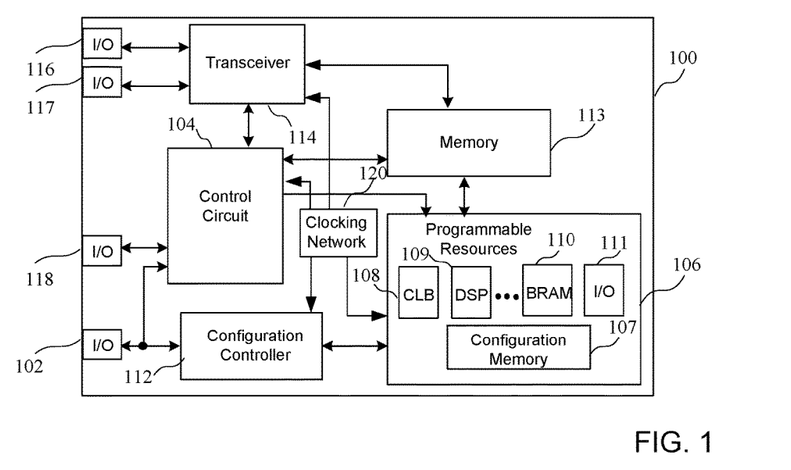
FIG. 1 is a block diagram of an integrated circuit having various circuit blocks.

Turning first to FIG. 1, a block diagram of an integrated circuit 100 comprising a circuit for transmitting and receiving data in the integrated circuit is shown. In particular, an input/output port 102 is coupled to a control circuit 104 that controls programmable resources 106 having configuration memory 107, configurable logic elements 108, digital signal processing (DSP) blocks 109, analog-to-digital (ADC), blocks of random access memory (BRAMs) 110, and I/O blocks 111. As will be described in more detail below, the various circuit blocks of the programmable resources 106 may be implemented as redundant circuits which may be selected based upon a voltage value of the reference voltage. Configuration data may be provided to the configuration memory 108 by a configuration controller 112. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods set forth below may be implemented using the elements of FIG. 1 or elements of another integrated circuit, such as the integrated circuit of FIGS. 8 and 9.

Figure 2:
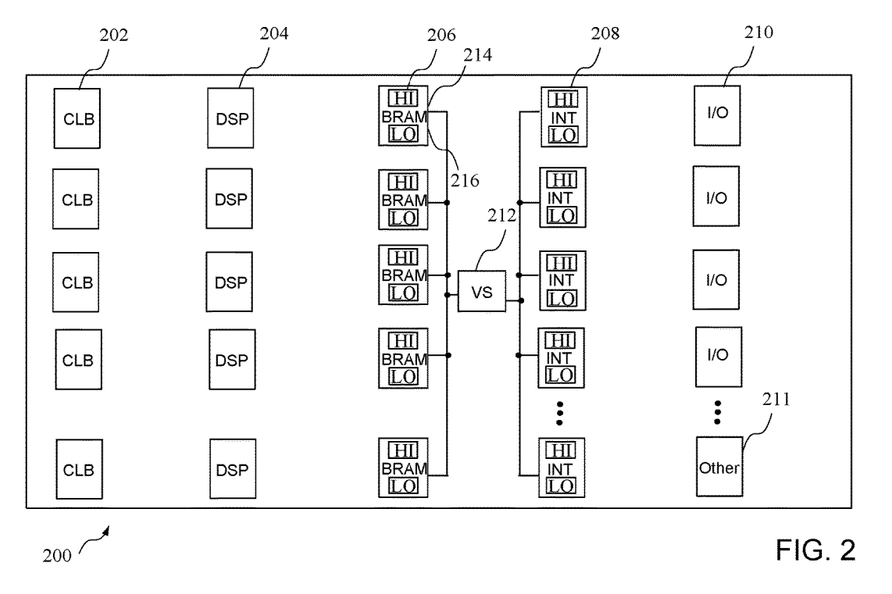
FIG. 2 is a block diagram of a circuit for selecting circuits of pluralities of redundant circuits using a voltage sensor.

Turning now to FIG. 2, a block diagram of a circuit 200 for selecting circuits of pluralities of redundant circuits using a voltage sensor is shown. The circuits and methods implement redundant circuits in one or more locations, where a circuit of the redundant circuit can be selected. According to one implementation, a plurality of redundant circuits can include a high performance circuit or power low power circuit, where either the high performance circuit or the low power circuit is selected. As will be described in more detail below, variations between the redundant circuits may lead to different performance characteristics, but will provide the same operation. By way of example, the redundant circuits receiving the same or similar inputs will generate the same or similar outputs, but may have different speed or power requirements. The differences in the redundant circuits may vary based upon the operation of the redundant circuit. That is, different types of redundant circuits may vary in different ways, where the differences may relate to changing operating characteristics of the particular circuit, enabling the selection of a redundant circuit that operates according to desired performance characteristics.

As shown in FIG. 2, various redundant circuits are shown. While exemplary redundant circuits are shown in FIG. 2 by way of example, it should be understood that a single plurality of redundant circuits could be implemented, or a greater number of redundant circuits could be implemented. Various circuit blocks are implemented, where redundant circuits are implemented is some of the circuit blocks. More particularly, columns of circuit blocks are shown, including CLBs 202, digital signal processor (DSP) blocks 204, blocks of Random Access Memory (BRAM) 206, interconnect (INT) elements (208), and I/O blocks 210, or other type of block 211. While the circuits blocks are shown in columns, it should be understood that the various circuit blocks could be implemented in different configurations. Also, while specific circuit blocks are shown in certain positions, it should be understood that elements of a specific type may be distributed over the integrated circuit device. For example, interconnect elements may be distributed over the integrated circuit device.

Some of the circuit block of FIG. 2 have redundant circuits. By way of example, each of the BRAM circuit blocks and the interconnect circuit blocks are controlled by a voltage sensor 212 and includes redundant circuits, shown here as a high performance circuit (HI) 214 and a low power circuit (LO) 216. As will be described in more detail below, the voltage sensor may detect a voltage level of a reference voltage and select one of the redundant circuits. While only two redundant circuits are shown by way of example, any number of redundant circuits could be implemented, such as three redundant circuits corresponding to the three voltage ranges Vmin, Vmid and Vhigh as will be described in more detail below. The selection of a redundant circuit by the voltage sensor 212 will be described in more detail in reference to FIGS. 5 and 6. While redundant circuits are shown by way of example in all of the BRAM circuit blocks and interconnect elements of FIG. 2, it should be understood that redundant circuits need not be included in all of the circuit blocks of a certain type, but may be included in only some of the circuit blocks of the specific type.

The voltage sensor 212 of FIG. 2 enables voltage driven performance optimization. On-chip voltage supplies may range from Vmin at approximately 0.65V to Vmid at approximately 0.73V to Vhigh at approximately 0.85V, where ranges for the 3 levels could include a range of Vmin from 0.65V to 0.69V, a range of Vmid from 0.70V to 0.77V, and Vhigh from 0.78 to 0.85V. Performance targets for integrated circuit devices are defined for each process, voltage and temperature (PVT), where lower voltage devices may have low performance targets compared to higher voltage devices. The voltage sensor 212 senses the voltage level of voltage supplies. Based on whether the sensed voltage is within the Vmin, Vmid or Vhigh range, a circuit optimized for the sensed voltage can be selected. Performance will be recovered for lower voltages by using faster circuits. Power will be recovered for high voltages by using power saving circuits.

Figure 3:
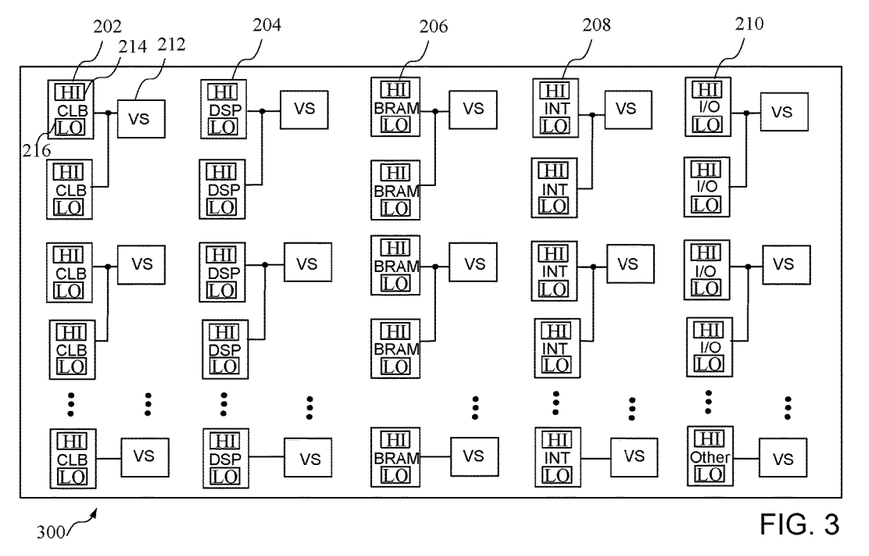
FIG. 3 is a block diagram of a circuit for selecting circuits of pluralities of redundant circuits using a plurality of voltage sensors.
Figure 4:
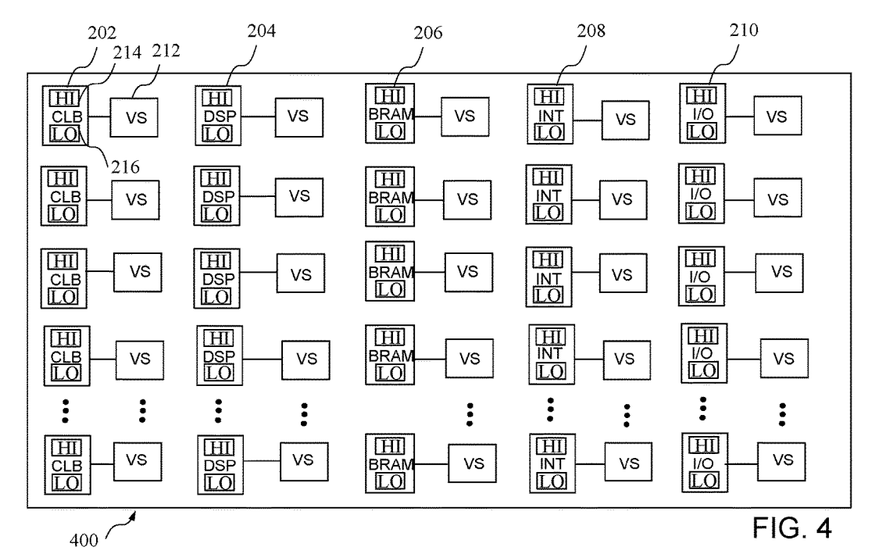
FIG. 4 is a block diagram of a circuit for selecting circuits of pluralities of redundant circuits each having a corresponding voltage sensor.

Turning now to FIG. 3, a block diagram of a circuit 300 for selecting circuits of pluralities of redundant circuits using a plurality of voltage sensors is shown. According to the implementation of FIG. 3, multiple control circuits having voltage sensors are implemented. The distributed control circuits enable detecting different voltages at different locations, and enable selectively controlling an operating mode of groups of circuit blocks. According to the circuit 400 of FIG. 4, a control circuit is associated with each circuit block of a plurality of redundant circuits. Alternatively, the control circuits of FIGS. 3 and 4 could be used with corresponding circuit blocks, but selectively used with fewer than all of the circuit blocks.

It should be noted that the voltage sensor can also enable difference modes of operation. For example, a high performance operation mode could be selected. In the high performance operation mode, faster combinational logic can be implemented, such as by implementing faster transistors (i.e. transistors having smaller transistor gate widths for example). Fast transistors could be implemented for example in interconnect elements between various logic blocks, as will be described in more detail below in reference to the programmable logic devices of FIGS. 9 and 10. Further, specific logic blocks themselves could be implemented to provide a high performance. For example, in the case of a CLB, a high performance configurable logic block could be implemented with additional Lookup Tables (LUTs). That is, a high performance CLE could be implemented with a more pipelined structure, providing more parallelism with more LUTs than a low power CLE. A CLE operating on a fast clock may make computation faster. A clock generation circuit generating a faster clock may be selected. The clock generation circuit may include a PLL, as well be described in more detail in reference to FIG. 6. Additional LUTs, faster clocks and CLE logic will make a computation faster using the CLE by enabling more parallel computation, as will be described in more detail below.

In a power saving mode, power saving circuits could be selected. For example, power saving circuits could include more power gated circuits and more clock gated circuits to reduce power consumption in the block. In the case of CLBs for example, the power saving circuits implemented as configurable logic blocks for example, could include fewer LUTs and logic elements, less pipelining and less parallelism. Also, a slow clock can save power. Therefore, a clock generation circuit (PLL) generating a slower clock may be selected. In contrast to a high performance CLB as described above, less pipelining in a low power CLE would increase the computation time. Finally, a bypass mode may be selected to bypass the operation of voltage sensor to provide a given user with the flexibility to automatically select a default circuit, as will be described below in reference to FIG. 5.

Figure 5:
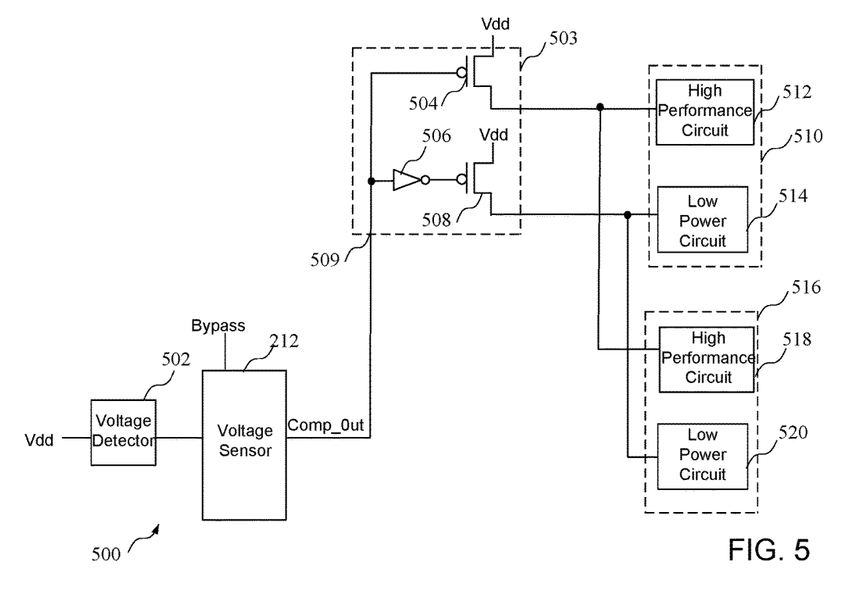
FIG. 5 is a block diagram of a circuit for enabling the selection of a redundant circuit.

Turning now to FIG. 5, a block diagram of a control circuit 500 for enabling the selection of a redundant circuit, which may include the voltage sensor 212, is shown. The control circuit 500 comprises a voltage detector 502 coupled to receive a reference voltage, shown here as Vdd, an output of which is provided as an input voltage to a voltage sensor 212. The input voltage to the voltage sensor comprises a reference voltage that may be a filtered voltage signal for example. An output of the voltage sensor 212 is coupled to a selection circuit 503. The selection signal (Comp_Out) generated at the output of the voltage sensor, which is used to control the application of the reference voltage to a selected redundant circuit to provide power to the redundant circuit.

More particularly, the selection circuit 503 will selectively route the reference voltage Vdd to one of the redundant circuits of the plurality of redundant circuits. That is, the selection circuit will route the reference voltage to one of the redundant circuits of the plurality of redundant circuits 510, shown here as a high performance circuit 512 and a low power circuit 514. The selection circuit 503 comprises control gates to enable routing the reference voltage to one of a group of redundant circuits, shown here as groups of high performance circuits and low power circuits. The selection signal is coupled to a plurality of control switches, including switch 504 shown here as a transistor, and input of an inverter 506, an inverted output of which is used to control a gate of a transistor 508. The selection signal is provided to a control terminal 509 of the selection circuit 503. As shown in FIG. 5, the selection signal will also enable applying the reference voltage Vdd to a selected circuit of a second group of redundant circuits 516, including high performance circuit 518 and low power circuit 520. For example, when the Comp_Out signal is low, transistor 504 is turned on, providing Vdd to the high performance circuit 512 and the high performance circuit 516. Similarly, when the Comp-Out signal is high, the low output of the inverter 506 turns on transistor 508, providing Vdd to the low power circuit 514 and the low power circuit 520. That is, only one of the redundant circuits of the group of redundant circuits receives the reference voltage. While the same reference voltage Vdd is applied to transistors 504 and 508, it should be understood that different reference voltage could be applied, depending upon the performance or operational goals to be achieved by the high performance circuits and the low power circuits. The redundant circuits could include the circuits of FIGS. 2_4 for example.

Figure 6:
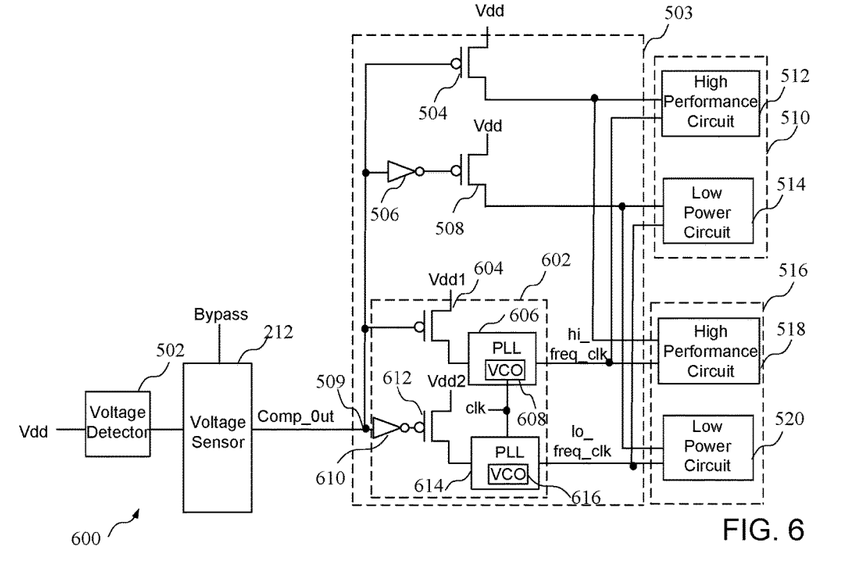
FIG. 6 is a block diagram of another circuit for enabling the selection of a redundant circuit.

In addition to selecting which redundant circuit of a group of redundant circuits to provide power to by selectively coupling a reference voltage to a selected circuit, the control circuit 600 of FIG. 6 may also include a clock control circuit 602 enabling the selective application of a clock signal to the high performance circuits or the low power circuits of the groups of redundant circuits. More particularly, the clock control circuit 602 comprises a control switch 604, shown here as a transistor, configured to receive the selection signal (Comp-_Out) at its gate. When the selection signal is low, the switch 604 is turned on to route the reference voltage Vdd1 to a clock generation circuit 606, shown here as a phase lock loop (PLL) having a voltage controlled oscillator 608 for example. The clock generation circuit 606 is configured to generate a high frequency clock (hi_freq_Clk) signal that is coupled to the high performance circuits 512 and 518. Similarly, an inverted selection signal generated at an output of an inverter 610 is coupled to control a switch 612, also shown as a transistor. When the selection signal is high, the output inverter is low to turn on the switch 612 and provide a reference voltage Vdd2 to a second clock generator 614. The second clock generator may also be a PLL having a VCO 616 that generates a low frequency clock (lo_freq_Clk) signal that is routed to the low power circuits. Vdd1 may be a greater voltage than Vdd2 to generate the higher frequency clocks. However, it should be understood that Vdd1 and Vdd2 could be the same voltage. Also, while the selection circuits 503 is shown separate from the voltage sensor 212, it may be implemented as a part of the voltage sensor as implemented in FIGS. 2-4.

It is also possible to bypass the voltage sensor and automatically select a default circuit of the redundant circuits regardless of a voltage level of the reference voltage. As will be described in reference to FIG. 7, a bypass signal may be provided to the voltage sensor to deactivate the voltage sensor, enabling the selection of a default circuit of the pluralities of redundant circuits. By way of example, the high performance circuit may be the default circuit of the pluralities of redundant circuits, and selected by the voltage sensor when an active bypass signal is provided.

Figure 7:
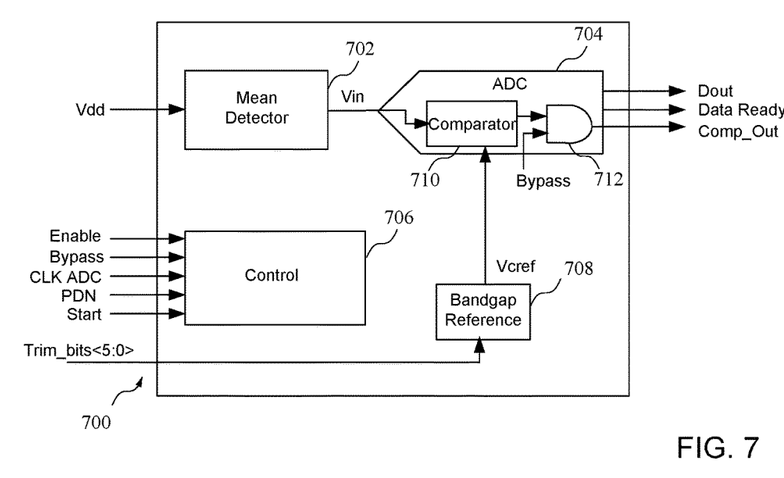
FIG. 7 is a block diagram of a voltage sensor of the circuit of FIG. 5.

Turning now to FIG. 7, a block diagram of a voltage sensor 700 is shown. The voltage sensor 700 may be implemented as the voltage sensor 212 in FIGS. 2-6. As shown in FIG. 7, a mean detector 702 receives the reference voltage Vdd and generates an average reference voltage Vin for an analog-to-digital converter (ADC) circuit 704. The mean detector 702 may contain filters, such as high pass filters, low pass filters, or band filters, to pass the positive peak voltage or negative peak voltage or mean voltage. That is, the dc voltage Vdd may be a stable signal, but may have positive peaks and negative peaks. A control circuit 706 receives control signals, including the bypass signal, an enable signal, an ADC clock signal (CLK ADC), a power down signal (PDN) to power down the voltage sensor, and a start signal to start the selection signal generation process. The bypass signal if "on" would disable (enable=0) the voltage sensor. The control circuit 706 may be a digital block which enables the gating of the Bypass, Start, and PDN input signals to activate various modes in which the circuit can function. The ADC circuit is used for conversion of an analog voltage to digital equivalent (Dout), such as by the use of a DAC and internal registers.

A reference voltage generator 708, which may be for example as a bandgap reference generator, is configured to receive a trim signal (Trim_bits<5:0>) that is used to generate a reference voltage for the ADC 704. The band gap reference circuit generates a reference voltage for the voltage sensor which is independent of temperature and process variations. The trim bits are used to set the voltage to defined limits to achieve desired voltage characteristic curves. The input voltage from the mean detector is converted to the digital output value (Dout) using a reference voltage (Vcref) from the bandgap reference circuit 708 coupled to the ADC 604. Dout gives the digital equivalent of the input voltage and the comparator output (Comp-Out) of comparator 710 is a single bit output to control the selection circuit. Therefore, a comparator could be implemented in the ADC circuit to determine whether the reference voltage generated by the mean detector is greater than a bandgap reference voltage, and therefore which of the redundant circuits to select.

In operation, the Vdd signal is provided to the voltage sensor to determine its value. The ADC circuit uses the comparator 710 to compare the Vin reference voltage with a comparator reference voltage Vcref from bandgap reference circuit. The Vin is compared against the comparator reference voltage, and an internal counter may increment or decrement depending on two inputs of comparator. The digital output of the comparator is the Comp_Out signal used by control circuitry to control the selection of the redundant circuits. The ADC 704 may also comprise a bypass circuit 712, shown here as a AND gate, to enable generating a known control signal for selecting a default circuit for each of the groups of redundant circuits, such as the high performance circuits.

Figure 8:
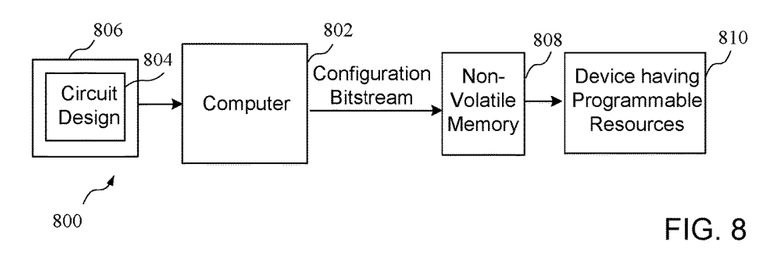
FIG. 8 is a block diagram showing a circuit enabling the configuration of a device having programmable resources.

Turning now to FIG. 8, a block diagram 800 of a system for programming a device having programmable resources according to an embodiment is shown. In particular, a computer 802 is coupled to receive a circuit design 804 from a memory 806, and generates a configuration bitstream that is stored in the non-volatile memory 808. As will be described in more detail below, the circuit design may be a high level design, such as a circuit design defined in a hardware description language (HDL). Also, the computer may be configured to run software that generates a configuration bitstream that is stored in the non-volatile memory 808 and provided to an integrated circuit 810 that may be a programmable integrated circuit, such as the integrated circuit described below in FIG. 9. As will be described in more detail below, bit of the configuration bitstream are used to configure programmable resources of the integrated circuit.

Figure 9:
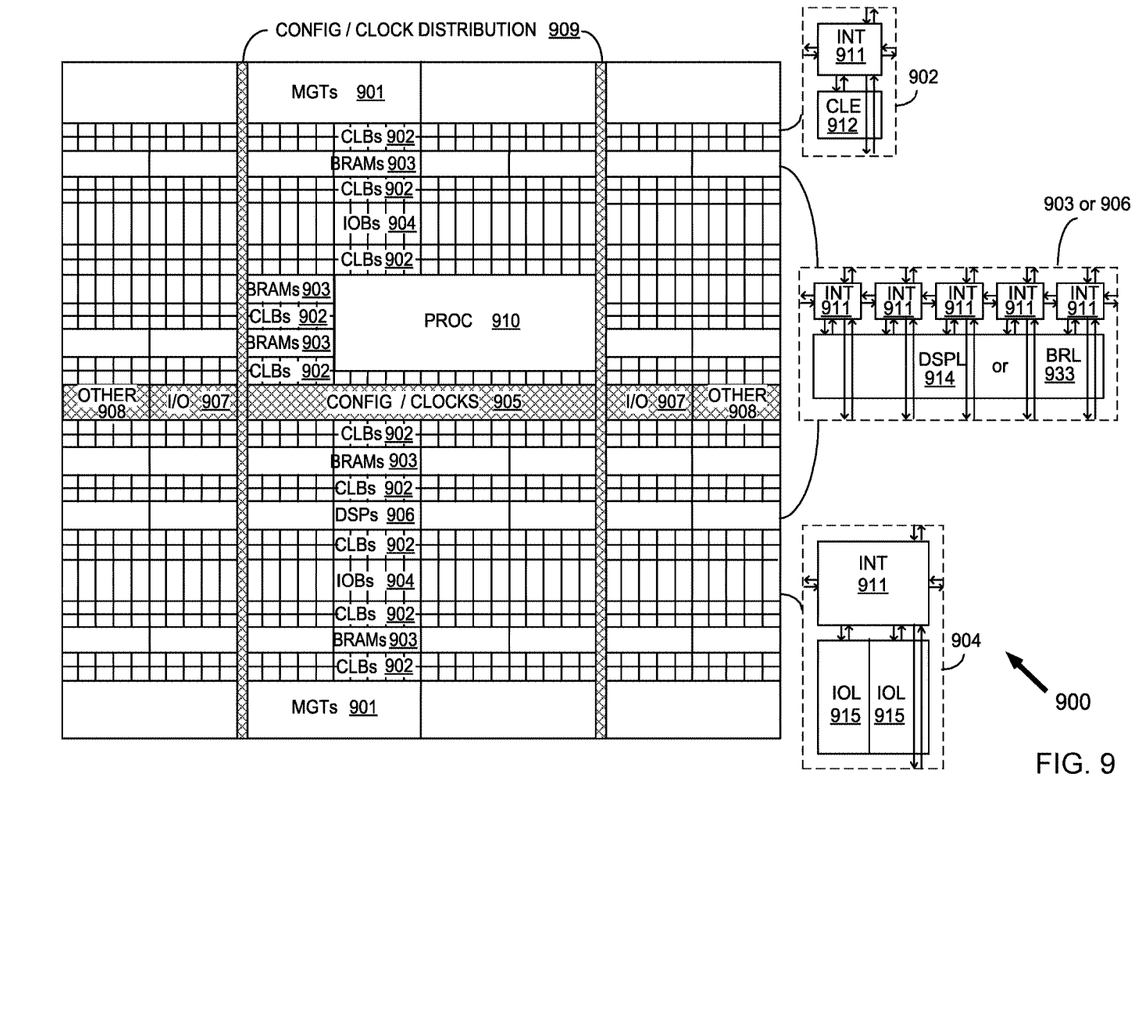
FIG. 9 is a block diagram of a device having programmable resources.

Turning now to FIG. 9, a block diagram 900 of a device having programmable resources including the circuits of FIGS. 1-7 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 906 may include a DSP logic element (DSPL) 914 in addition to an appropriate number of programmable interconnect elements. An 10B 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the embodiment of FIG. 9 relates to an integrated circuit having programmable resources, it should be understood that the circuits and methods set forth in more detail below could be implemented in any type of ASIC.

Figure 10:
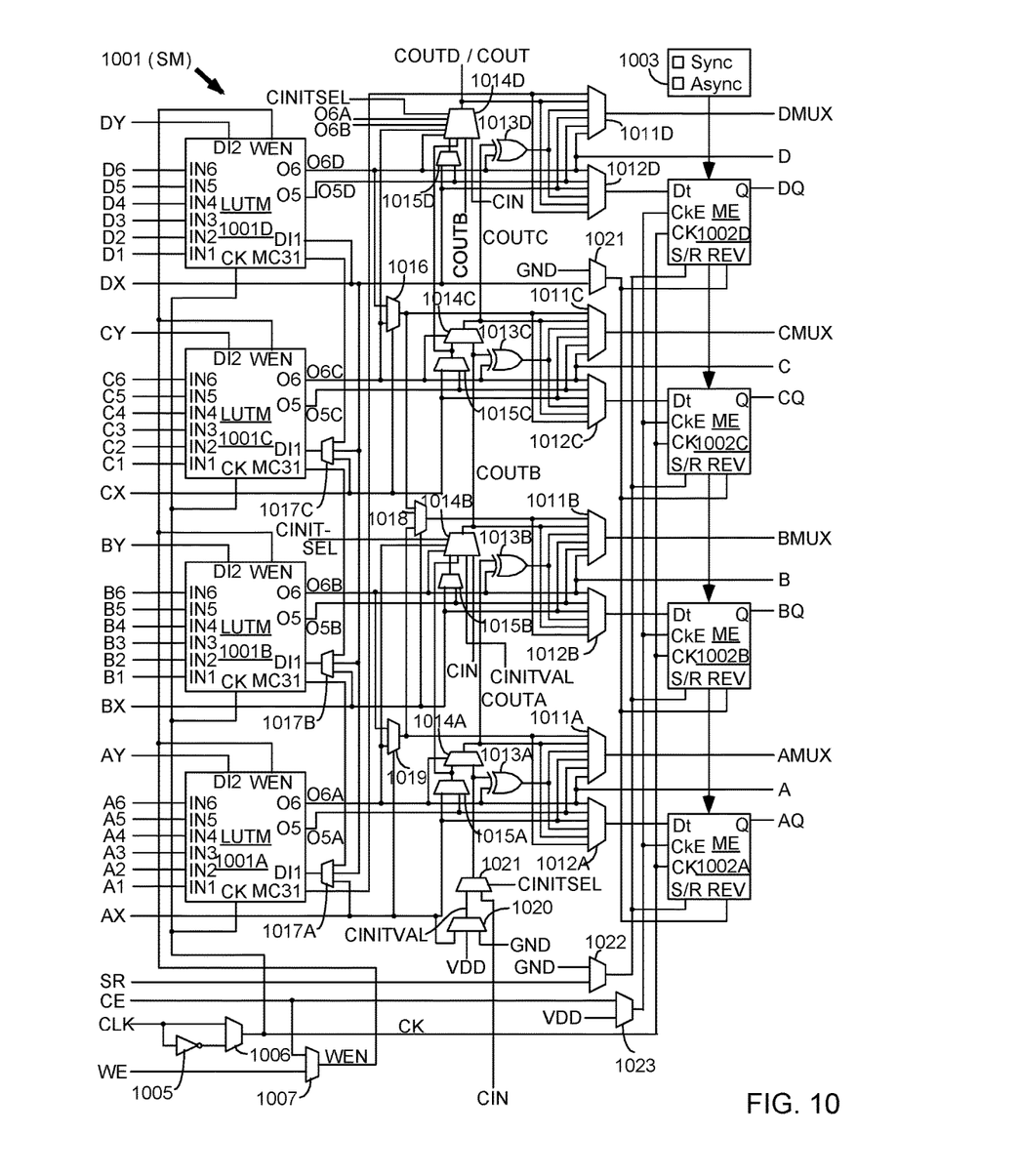
FIG. 10 is a block diagram of a configurable logic element that could be implemented in the device having programmable resources of FIG. 9.

Turning now to FIG. 10, a block diagram 1001 of a configurable logic element that could be implemented in the device having programmable resources of FIG. 9 is shown. In particular, FIG. 10 illustrates in simplified form a configurable logic element of a configuration logic block 902 of FIG. 9. In the embodiment of FIG. 10, slice M 1001 includes four lookup tables (LUTMs) 901A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Figure 11:
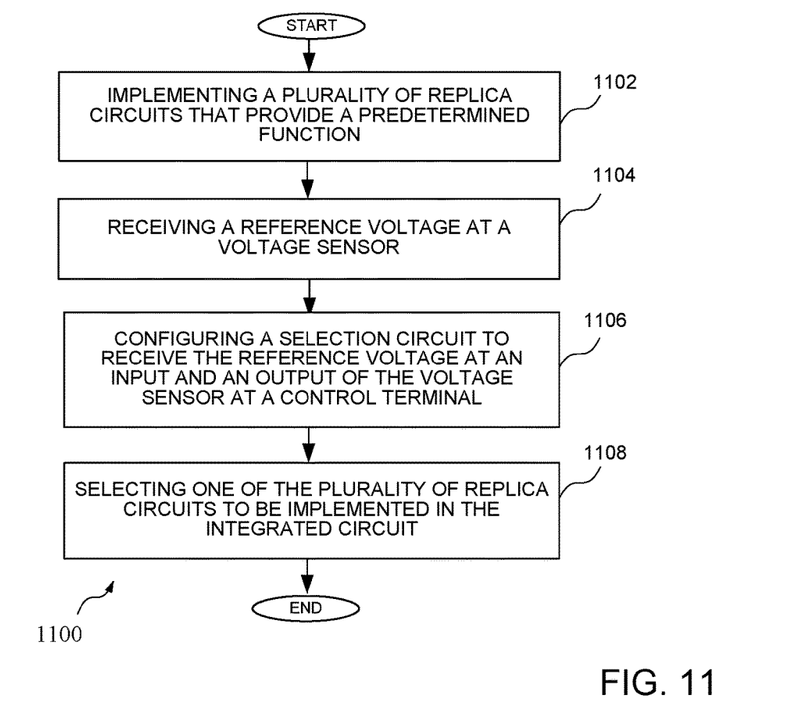
FIG. 11 is a flow chart showing a method of enabling the selection of a circuit.

Turning now to FIG. 11, a flow chart 1100 shows a method of enabling the selection of a circuit. The method of FIG. 11 may be implemented using any of circuits of FIGS. 1-10, or other suitable circuits. In particular, a plurality of replica circuits that provide a predetermined function are implemented at a block 1102. The replica circuits may be implemented as shown in FIGS. 2-4 for example. A reference voltage at a voltage sensor are received at a block 1104. A selection circuit is configured to receive the reference voltage at an input and an output of the voltage sensor at a control terminal at a block 1106. One of the plurality of replica circuits is selected to be implemented in the integrated circuit at a block 1108. Other elements of the method could be performed as described above in reference to the various circuits.

It can therefore be appreciated that new circuits for and methods of enabling the selection of a circuit have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. An integrated circuit enabling the selection of a circuit, the integrated circuit comprising:
   a plurality of redundant circuits providing a predetermined function;
   a voltage sensor coupled to receive a reference voltage; and
   a selection circuit coupled to the voltage sensor and the reference voltage, wherein the selection circuit selects one of the plurality of redundant circuits to be implemented in the integrated circuit based upon a detected voltage of the reference voltage.

2. The integrated circuit of claim 1 wherein the plurality of redundant circuits comprises a first pair of redundant circuits and a second pair of redundant circuits, and the selection circuit enables routing of the reference voltage to a first redundant circuit or a second redundant circuit of the first pair of redundant circuits and a third redundant circuit or a fourth redundant circuit of the second pair of redundant circuits.

3. The integrated circuit of claim 1 wherein the selection circuit comprises a plurality of switches configured to control the selection of one of the plurality of redundant circuits to be implemented in the integrated circuit based upon a detected voltage.

4. The integrated circuit of claim 1 wherein the voltage sensor comprises a comparator, and an output of the comparator is coupled to a control terminal of the selection circuit.

5. The integrated circuit of claim 4 further comprising a bypass circuit coupled to receive a bypass signal, wherein the bypass circuit enables the selection of a default redundant circuit of the plurality of redundant circuits.

6. The integrated circuit of claim 1 wherein the selection circuit further comprises a clock control circuit for selecting a clock signal that is routed to the selected one of the plurality of redundant circuits.

7. The integrated circuit of claim 6 wherein the clock control circuit generates a first reference clock and a second reference clock.

8. The integrated circuit of claim 1 further comprising a plurality of voltage sensors coupled to receive the reference voltage, wherein each voltage sensor is configured to control a plurality of redundant circuits.

9. The integrated circuit of claim 8 wherein the plurality of voltage sensors are distributed over the integrated circuit.

10. The integrated circuit of claim 8 wherein a voltage sensor of the plurality of voltage sensors is associated with predetermined redundant circuits of the plurality of redundant circuits.

11. A method of enabling the selection of a circuit, the method comprising:
  implementing a plurality of redundant circuits that provide a predetermined function;
  receiving a reference voltage at a voltage sensor;
  configuring a selection circuit to receive the reference voltage at an input and an output of the voltage sensor at a control terminal; and
  selecting one of the plurality of redundant circuits to be implemented in the integrated circuit based upon a detected voltage of the reference voltage.

12. The method of claim 11 wherein implementing a plurality of redundant circuits comprises implementing a first pair of redundant circuits and a second pair of redundant circuits, and wherein enabling routing of the reference voltage to a first redundant circuit or a second redundant circuit of the first pair of redundant circuits and a third redundant circuit or a fourth redundant circuit of the second pair of redundant circuits.

13. The method of claim 11 further comprising configuring a plurality of switches to control the selection of one of the plurality of redundant circuits to be implemented in the integrated circuit based upon a detected voltage.

14. The method of claim 13 wherein receiving a reference voltage at a voltage sensor comprises receiving a reference voltage at a comparator circuit, and coupling an output of the comparator circuit to the control terminal of the selection circuit.

15. The method of claim 11 further comprising enabling the selection of a default redundant circuit of the plurality of redundant circuits using a bypass signal.

16. The method of claim 11 wherein implementing a plurality of redundant circuits comprises implementing a first redundant circuit adapted to operate using a first voltage and implementing a second redundant circuit adapted to operate using a second voltage.

17. The method of claim 11 further comprising generating a first reference clock and a second reference clock.

18. The method of claim 11 further comprising implementing a plurality of voltage sensors coupled to receive the reference voltage.

19. The method of claim 18 further comprising distributing the plurality of voltage sensors over the integrated circuit.

20. The method of claim 18 further comprising associating the plurality of voltage sensors with predetermined groups of redundant circuits of the plurality of redundant circuits.

* * * * *